United States Patent
Li

(10) Patent No.: US 9,046,560 B2
(45) Date of Patent: Jun. 2, 2015

(54) SYSTEM AND METHOD FOR HIGH RESISTANCE GROUND FAULT DETECTION AND PROTECTION IN POWER DISTRIBUTION SYSTEMS

(75) Inventor: Huaqiang Li, Menomonee Falls, WI (US)

(73) Assignee: Eaton Corporation, Cleveland, OH (US)

( * ) Notice: Subject to any disclaimer, the term of this patent is extended or adjusted under 35 U.S.C. 154(b) by 304 days.

(21) Appl. No.: 13/487,322

(22) Filed: Jun. 4, 2012

(65) Prior Publication Data

US 2013/0322133 A1    Dec. 5, 2013

(51) Int. Cl.
| | |
|---|---|
| H02M 5/458 | (2006.01) |
| G01R 31/02 | (2006.01) |
| H02H 3/52 | (2006.01) |
| H02H 7/122 | (2006.01) |
| G06F 19/00 | (2011.01) |
| G01R 31/08 | (2006.01) |
| H02H 3/16 | (2006.01) |

(52) U.S. Cl.
CPC .............. G01R 31/025 (2013.01); H02H 3/165 (2013.01); H02H 3/52 (2013.01); H02H 7/1227 (2013.01)

(58) Field of Classification Search
USPC .......................................................... 361/44
See application file for complete search history.

(56) References Cited

U.S. PATENT DOCUMENTS

| | | | |
|---|---|---|---|
| 4,297,738 A | 10/1981 | Lee | |
| 5,245,498 A * | 9/1993 | Uchida et al. | ................... 361/47 |
| 5,508,620 A | 4/1996 | Pfiffner | |
| 5,945,802 A | 8/1999 | Konrad et al. | |
| 8,013,612 B2 | 9/2011 | Morini et al. | |
| 2009/0080127 A1 | 3/2009 | Mirafzal | |
| 2009/0296289 A1 | 12/2009 | Valdez et al. | |
| 2013/0027077 A1 * | 1/2013 | Oughton et al. | ......... 324/764.01 |

FOREIGN PATENT DOCUMENTS

| | | |
|---|---|---|
| EP | 2178185 A2 | 4/2010 |
| WO | 03044545 A1 | 5/2003 |
| WO | 2012056287 A2 | 5/2012 |

OTHER PUBLICATIONS

George et al., "PGR-5701 Ground Fault Monitor With Variable Frequency Drive," Littlefuse Startco Test Report, Canada, pp. 1-26.

(Continued)

*Primary Examiner* — Theinvu Tran
*Assistant Examiner* — Kevin J Comber
(74) *Attorney, Agent, or Firm* — Ziolkowski Patent Solutions Group, SC

(57) ABSTRACT

A system and method for detecting high resistance ground faults in a power distribution system is disclosed. A fault detection and protection system is provided that includes a plurality of current sensors to measure current on the three phase output of the converter-inverter arrangement of the power distribution system and a controller configured to measure the three phase current on the three phase output, extract a fundamental current component for each phase of the three phase output, extract a third harmonic component for each phase of the three phase output, compare the fundamental current component and the third harmonic component extracted from each phase to a first threshold and a second threshold, respectively, and detect a ground fault on a phase of the three phase output based on the comparisons of the fundamental current component and the third harmonic component to the first and second thresholds.

17 Claims, 4 Drawing Sheets

(56) References Cited

OTHER PUBLICATIONS

Rodriguez-Valdez et al., "Method for line-ground fault detection in Variable Frequency Drives," IEEE, 2011, pp. 1-7.

Skibinski et al., "Part I: Application Guidelines for High Resistance Grounding of Low Voltage Common AC Bus & Common DC Bus PWM Drive Systems," IEEE Pulp and Paper Industry Technical Conference, Jun. 22-27, 2008, pp. 1-8.

\* cited by examiner

SYSTEM AND METHOD FOR HIGH RESISTANCE GROUND FAULT DETECTION AND PROTECTION IN POWER DISTRIBUTION SYSTEMS

BACKGROUND OF THE INVENTION

The present invention relates generally to power distribution systems and, more particularly, to a system and method for detecting high resistance ground faults in a power distribution system and protecting the power distribution system from such ground faults upon detection thereof.

A typical power distribution system includes a converter, an inverter and a mechanical load such as a motor. The converter is typically linked to a three phase source that provides three phase AC power and converts the three phase power to DC power across positive and negative DC buses. The DC buses feed the inverter which generates three phase AC power on output lines that are provided to the load. The inverter controls the three phase AC voltages and currents to the load so that the load can be driven in a desired fashion. Cables connect the power source to the converter and also connect the inverter to the load.

One common type of three-phase power distribution system is an adjustable speed drive (ASD). ASDs are frequently used in industrial applications to condition power and otherwise control electric driven motors such as those found with pumps, fans, compressors, cranes, paper mills, steel mills, rolling mills, elevators, machine tools, and the like. ASDs typically provide a volts-per-hertz or vector controls and are adept at providing variable speed and/or variable torque control to an electric driven motor, such that ASDs have greatly improved the efficiency and productivity of electric driven motors and applications.

Power distribution systems such as ASDs require protection from inadvertent cable and load (e.g., motor) failures which can lead to undesirable ground faults. The root cause of cable failures is often cable insulation breakdown and therefore most ground faults occur in the cables between the power source and the converter or between the inverter and the load. When a ground fault occurs, the results can be extremely costly. For instance, ground faults often result in power interruptions, equipment failure and damage, uncoordinated system decisions with potential for overall plant interruptions, degraded or lost production and overall customer frustration.

Resistance grounding systems are used in industrial electrical power distribution facilities to limit phase-to-ground fault currents. Generally speaking, there are two types of resistors used to tie a power distribution system's neutral to ground: low resistance and high resistance. High Resistance Ground (HRG) systems limit the fault current when one phase of the system shorts or arcs to ground, but at lower levels than low resistance systems. In the event that a ground fault condition exists, the HRG typically limits the current to 5-10A, though most resistor manufacturers label any resistor that limits the current to 25A or less as high resistance.

HRG systems are commonly seen in industrial applications where continued operation is important to the process, such as in power distribution systems where any power source downtime has a dramatic economic cost. HRG systems have gained popularity in such applications due to their ability to continue operation in lieu of a single line-ground fault and improved ability to limit escalation of the single line-ground fault into a multi-phase event. Additionally, HRG systems function to suppress transient line to ground over voltages during a ground fault, eliminate arc flash hazards with phase to ground faults, and reduce equipment damage at the point of ground fault.

Since ground fault conditions in HRG systems do not draw enough current to reliably trigger fault current sensors in an associated motor drive, ground fault detections systems must be employed to detect HRG faults. Various such ground fault detection systems and methods have previously been implemented to locate ground faults. For example, in US Publication No. 2009/0296289, detection of a ground fault in the HRG system is accomplished by injecting a common mode voltage into the three phase system and measuring the system response, with the sensed output voltages then being filtered to determine the HRG fault occurrence. In another example, and as set forth in US Publication No. 2009/0080127, detection of a ground fault in the HRG system is accomplished by measuring the DC bus voltage in the HRG system. However, while such systems function to detect a ground fault in the HRG system, the methods employed in those systems are either computationally cumbersome or intrusive to the system. Additionally, existing ground fault detection systems and methods fail to locate the ground fault in the HRG system (i.e., identify where and which phase the fault occurs on). As such, challenges remain in HRG systems with respect to identifying HRG faults in a cost effective manner and locating the HRG fault in the system.

It would therefore be desirable to provide a system and method that provides a computationally efficient approach to detect an HRG fault in a three-phase power distribution system and identify the HRG fault location in a particular phase.

BRIEF DESCRIPTION OF THE INVENTION

Embodiments of the present invention provide a system and method for detecting HRG faults in a power distribution system and identifying the location of such ground faults.

In accordance with one aspect of the invention, a power distribution system includes a converter-inverter arrangement having an input connectable to a three phase AC power source and a three phase output connectable to an input terminal of a load, the converter-inverter arrangement configured to control current flow and terminal voltages in the load. The power distribution system also includes a fault detection and protection system connected to the converter-inverter arrangement, with the fault detection and protection system including a plurality of current sensors configured to measure a current on the three phase output of the converter-inverter arrangement and a controller configured to measure the three phase current on the three phase output of the converter-inverter arrangement, extract a fundamental current component for each phase of the three phase output of the converter-inverter arrangement, extract a third harmonic component for each phase of the three phase output of the converter-inverter arrangement, compare the fundamental current component and the third harmonic component extracted from each phase to a first threshold and a second threshold, respectively, and detect a ground fault on a phase of the three phase output based on the comparisons of the fundamental current component and the third harmonic component to the first and second thresholds.

In accordance with another aspect of the invention, a method is provided for detecting a high resistance ground fault in a power distribution system that includes an AC motor drive in series between an AC power source and an AC motor, with the AC motor drive configured to condition a three phase output to the AC motor. The method includes measuring current on each of a first phase, a second phase, and a third phase of the three phase output to the AC motor, extracting a fundamental current component for each of the first phase, second phase, and third phase, and extracting a third harmonic component for each of the first phase, second phase, and third phase. The method also includes comparing the fundamental current component and the third harmonic component extracted from each of the first phase, second phase, and third phase to a fundamental component threshold and a third harmonic threshold, respectively and detecting a ground fault on any of the first phase, second phase, and third phase based on the comparisons of the fundamental current component and the third harmonic component on each phase to the fundamental and third harmonic thresholds. If a ground fault is detected, the method further includes identifying on which of the first phase, second phase, or third phase the ground fault is present.

In accordance with yet another aspect of the invention, a system for detecting a ground fault in a high resistance ground (HRG) power distribution system includes a plurality of current sensors to measure current on a three phase output of an inverter in the HRG power distribution system and a controller configured to measure the three phase current on the three phase output of the inverter, extract a fundamental current component for each phase of the three phase output, extract a third harmonic component for each phase of the three phase output, compare the fundamental current component and the third harmonic component extracted from each phase to a fundamental component threshold and a third harmonic component threshold, respectively, and detect a ground fault on a phase of the three phase output based on the comparisons of the fundamental current component and the third harmonic component on each phase to the fundamental component and third harmonic component thresholds.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE PREFERRED EMBODIMENT

The embodiments of the invention set forth herein relate to a system and method for detecting HRG faults in a power distribution system and protecting the power distribution system from such ground faults upon detection thereof.

Figure 1:
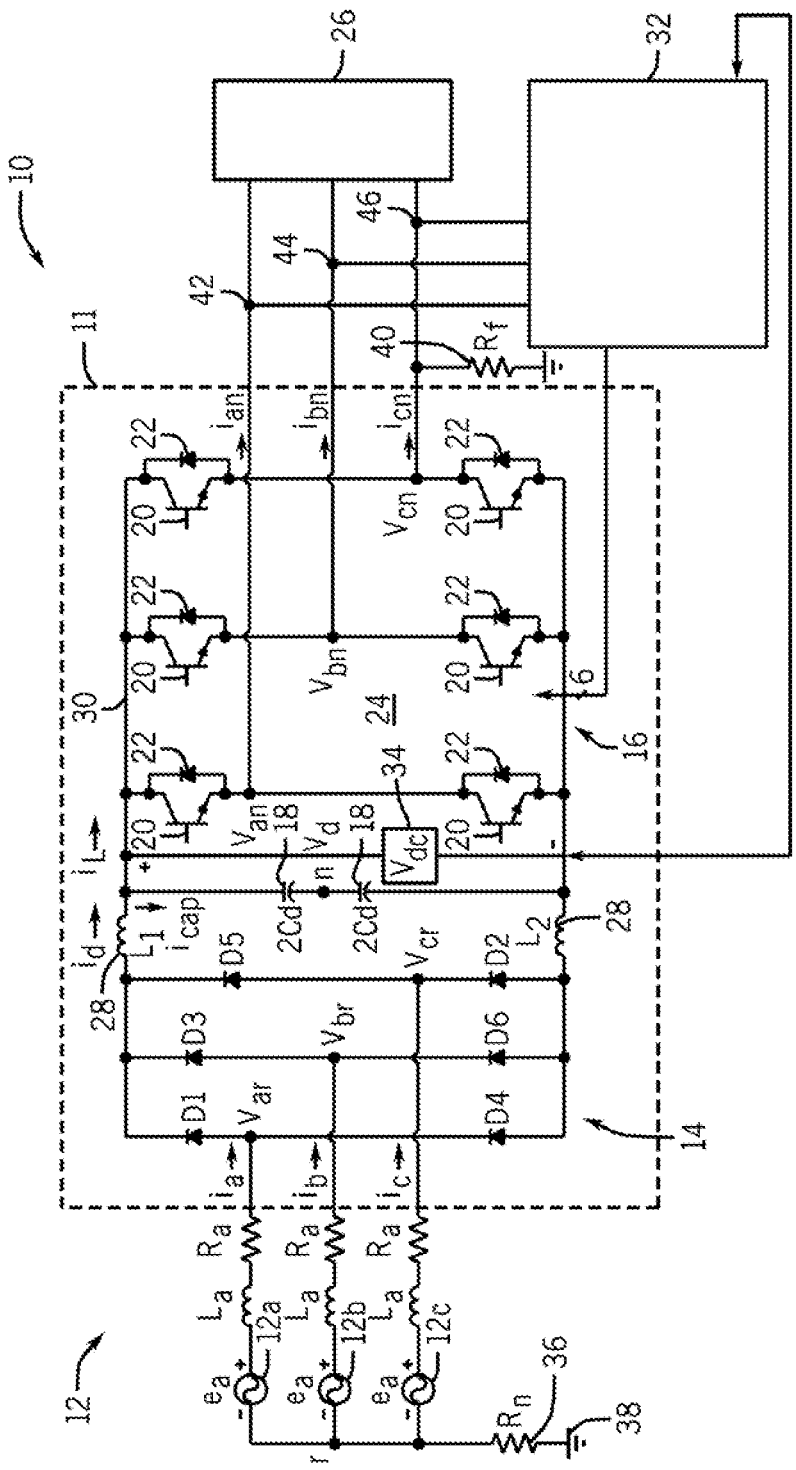
FIG. 1 a schematic of an adjustable speed motor drive (ASD) in a high resistance ground (HRG) configuration, according to an embodiment of the invention.

Embodiments of the invention are directed to power distribution systems encompassing a plurality of structures and control schemes. According to an exemplary embodiment of the invention, and as shown in FIG. 1, a power distribution system 10 is provided that may be implanted with embodiments of the invention. In the embodiment of FIG. 1, power distribution system 10 includes an AC motor drive 11 in the form of an adjustable speed drive (ASD) is shown in FIG. 1. The ASD 11 may be designed to receive a three AC power input, rectify the AC input, and perform a DC/AC conversion of the rectified segment into a three-phase alternating voltage of variable frequency and amplitude that is supplied to a load. In a preferred embodiment, the ASD 11 operates according to an exemplary volts-per-hertz or vector control characteristics. In this regard, the motor drive provides voltage regulation in steady state, and fast dynamic step load response over a full load range.

In an exemplary embodiment, a power source 12 generates a three-phase AC input 12a-12c is fed to power distribution system 10. According to embodiments of the invention, the power source 12 that generates the three-phase AC input 12a-12c may be in the form of a delta or wye source transformer, although other arrangements and power source configurations are also recognized as being able to provide three-phase AC input 12a-12c. The three-phase AC input 12a-12c is provided to a three-phase rectifier bridge 14. The input line impedances are equal in all three phases. The rectifier bridge 14 converts the AC power input to a DC power such that a DC link voltage is present between the rectifier bridge 14 and a switch array 16. The link voltage is smoothed by a DC link capacitor bank 18. The switch array 16 is comprised of a series of insulated gate bipolar transistor switches 20 (IGBTs) and anti-parallel diodes 22 that collectively form a PWM (pulse width modulated) inverter 24. The PWM inverter 24 synthesizes AC voltage waveforms with a fixed or a variable frequency and amplitude for delivery to a load, such as an induction motor 26. DC link chokes L1, L2 (indicated in FIG. 1 as 28) are also provided in AC motor drive 11 and are positioned on the positive and negative rails of the DC link 30. The DC link chokes 28 provide energy storage and filtering on the DC link during operation of AC motor drive 11 and motor 26.

Control of AC motor drive 11 and operation of the inverter 24 is via a controller 32, which may further be comprised of a plurality of controllers that perform high speed operations such as volts-per-hertz or vector control algorithms, space-vector modulation, DC link voltage decoupling, and protection, for example. The controller 32 interfaces to the PWM inverter 24 via gate drive signals and sensing of the DC link voltage and pole currents (by way of a voltage sensor 34 for example) such that changes in DC link voltage can be sensed. These voltage changes can be interpreted as transient load conditions and are used to control switching of the switch array 16 of PWM inverter 24 such that near steady-state load conditions are maintained. Additionally, controller 32 functions to identify ground current related faults in power distribution system 10 and protect the power distribution system from such faults, including protecting the power source transformer 12 such as by preventing transformer winding insulation degradation. In performing such a fault detection and protection, control system receives three-phase output current as input, while outputting fault identification and protection signals responsive to the inputs, as will be explained in greater detail below.

According to an exemplary embodiment of the invention, and as shown in FIG. 1, power distribution system 10 is configured as a High Resistance Ground (HRG) system that limits phase-to-ground fault currents. That is, the HRG system provides protection from inadvertent cable and load (e.g., motor) failures that can lead to undesirable ground faults by limiting the fault current when one phase of the system shorts or arcs to ground. In order to configure power distribution system 10 as an HRG system, a resistor 36 ($R_n$) is placed between the three-phase neutral point of the power source 12 and ground 38. In a wye connected system, the resistor 36 is placed between the three-phase neutral point of the power source 12 and ground 38, while in a delta connected system, an artificial neutral is created by using a zig-zag transformer and then the resistor 36 is placed between the artificial neutral and ground 38. The resistor 36 is configured to limit the current to 5-10 amps, for example, in the event that a ground fault condition exists.

Also shown in FIG. 1 is the resistance value in the faulted location in ASD 11, identified as a resistor 40 ($R_f$), with such a fault occurring in the form of a short through a wire/cable, breaker, or commutator, for example. The resistance value of $R_f$ can vary based on the particular fault that occurs and can range from zero to a larger value that is typically less than the resistance of resistor 36. The resistance value in the faulted location in ASD 11 therefore contributes to the overall fault current in power distribution system 10.

As shown in FIG. 1, control system 32 receives three-phase output current as inputs, such as by way of current sensors 42, 44, 46 positioned on the three-phase output of ASD 11. Based on an analysis of the three-phase current, control system 32 functions to identify HRG faults in power distribution system 10 and protect the power distribution system from such faults, including protecting against transformer winding insulation degradation.

Figure 2:
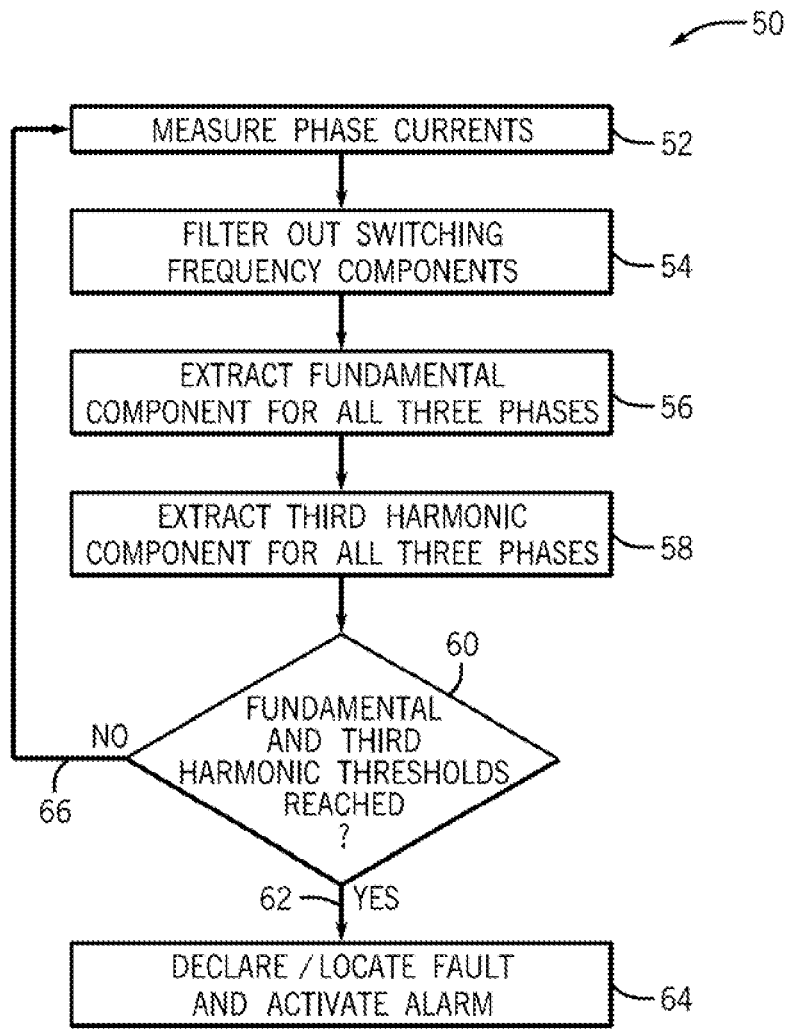
FIG. 2 is a flowchart illustrating a technique for detection of a HRG ground fault in the ASD of FIG. 1, according to an embodiment of the invention.

Referring now to FIG. 2, and with continued reference to FIG. 1, an exemplary embodiment of a technique 50 for detection of a HRG fault in a power distribution system, as well as for locating such an HRG fault in the system, is shown according to an embodiment of the invention. The technique 50 may be implemented by way of a controller associated with an ASD, such as controller 32 connected to ASD 11. As shown in FIG. 2, technique 50 begins at STEP 52 with a measuring of the phase current from each of the three phases of the ASD output, such as by way of current sensors 42, 44, 46. Upon a measurement of the phase currents of the three-phase output, technique 50 continues at STEP 54, where a filtering of the three-phase current is performed in order to account for/filter out a high frequency current ripple that is present due to IGBT switching in PWM inverter 24. For example, if a switching frequency of 5 kHz is used in the PWM inverter, then a low pass filtering can be performed to remove the 5 kHz and higher frequency current ripple components.

The measured phase current for each phase is therefore defined as:

$$i = I_1 * \cos\theta + I_3 * \cos 3\theta \quad \text{[Eqn. 1]},$$

where $I_1$ is the amplitude of the fundamental current component, $I_3$ is the amplitude of the third harmonic component (if it exists), and 0 is the speed at which the load is commanded to run. According to one embodiment of the invention, the fundamental component/fundamental frequency is 60 Hz and the third harmonic component is 180 Hz, as is standard in North America, although it is recognized that the fundamental component and the third harmonic component could be 50 Hz and 150 Hz, respectively, as is standard in Europe.

According to an exemplary embodiment, the three-phase output current of the ASD 11 is measured periodically over a set period of time, with a plurality of current measurements for each phase being stored in controller 32 and a current value for each phase being calculated based on the stored plurality of current measurements for each phase. In a next step of technique 50, the phase current is then analyzed in order to extract a fundamental current component for each phase of the three-phase output, as indicated at STEP 56. The fundamental current component for each phase of the three-phase output is extracted according to:

$$\frac{1}{2\pi}\int_0^{2\pi}(I_1\cos\theta + I_3\cos 3 d\theta)*\cos\theta * d\theta = \frac{I_1}{2} \quad \text{[Eqn. 2]}$$

$$\frac{1}{2\pi}\int_0^{2\pi}(I_1\cos\theta + I_3\cos 3 d\theta)*\sin\theta * d\theta = 0, \quad \text{[Eqn. 3]}$$

where $I_1$ is the amplitude of the fundamental current component, $I_3$ is the amplitude of the third harmonic component, and 0 is the speed at which the load is commanded to run. In extracting the fundamental current component for each phase of the three-phase output, both [Eqn. 2] and [Eqn. 3] are performed in order to run a self-check, with the output of [Eqn. 3] being zero when the calculations are performed properly. It is noted that in extracting the fundamental current component for each phase of the three-phase output by way of [Eqn. 2] and [Eqn. 3], no total Fast Fourier Transform (FFT) is employed in the calculations, such that the computational burden imposed on controller 32 is minimized.

In addition to analyzing the three-phase current in order to extract the fundamental current component, technique 50 also analyzes the three-phase current in order to extract the third harmonic component for each phase of the three-phase output, as indicated at STEP 58. The third harmonic component for each phase of the three-phase output is extracted according to:

$$\frac{1}{2\pi}\int_0^{2\pi}(I_1\cos\theta + I_3\cos 3\theta)*\cos 3\theta * d\theta = \frac{I_3}{2} \quad \text{[Eqn. 4]}$$

$$\frac{1}{2\pi}\int_0^{2\pi}(I_1\cos\theta + I_3\cos 3\theta)*\sin 3 d\theta * d\theta = 0, \quad \text{[Eqn. 5]}$$

where $I_1$ is the amplitude of the fundamental current component, $I_3$ is the amplitude of the third harmonic component, and θ is the speed at which the load is commanded to run. In extracting the third harmonic component for each phase of the three-phase output, both [Eqn. 4] and [Eqn. 5] are performed in order to run a self-check, with the output of [Eqn. 5] being zero when the calculations are performed properly. Again, the third harmonic component is calculated without using a total FFT so as to minimize the computational burden imposed on controller 32.

Upon extraction of the fundamental and third harmonic components, technique 50 then continues at STEP 60, where a determination is made as to whether the fundamental component and/or third harmonic component extracted from each phase of the three-phase output exceeds a pre-determined threshold that is set for the fundamental and third harmonic components. The pre-determined thresholds for the fundamental component and the third harmonic component will vary depending on the normal fundamental component and third harmonic component levels (i.e., fundamental and third harmonic can be 60/180 Hz, 50/150 Hz, etc.).

If it is determined at STEP 60 that the extracted fundamental component and third harmonic component of any phase of the three-phase current output exceed the pre-determined thresholds, indicated at 62, then technique continues at STEP 64 where a HRG fault is declared as being present in power distribution system 10 and an alarm is activated, such as some sort of audible or visual alarm. In declaring that an HRG fault is present in power distribution system 10, the location of the fault on a particular phase is also identified. That is, by determining on which phase of the three-phase current output the extracted fundamental component and third harmonic component exceed the current thresholds, the location of the fault on a particular phase is easily achieved. Appropriate steps can then be implemented to protect components in power distribution system 10 from damage, such as damage that might occur to the transformer windings insulation.

Conversely, if it is determined at STEP 60 that the extracted fundamental component and third harmonic component of any phase of the three-phase current output do not exceed the pre-determined thresholds, indicated at 66, then technique loops back to STEP 52, where additional measuring and analyzing of the phase current from each of the three phases of the ASD output is performed in order to continue monitoring for an HRG fault.

Figure 3:
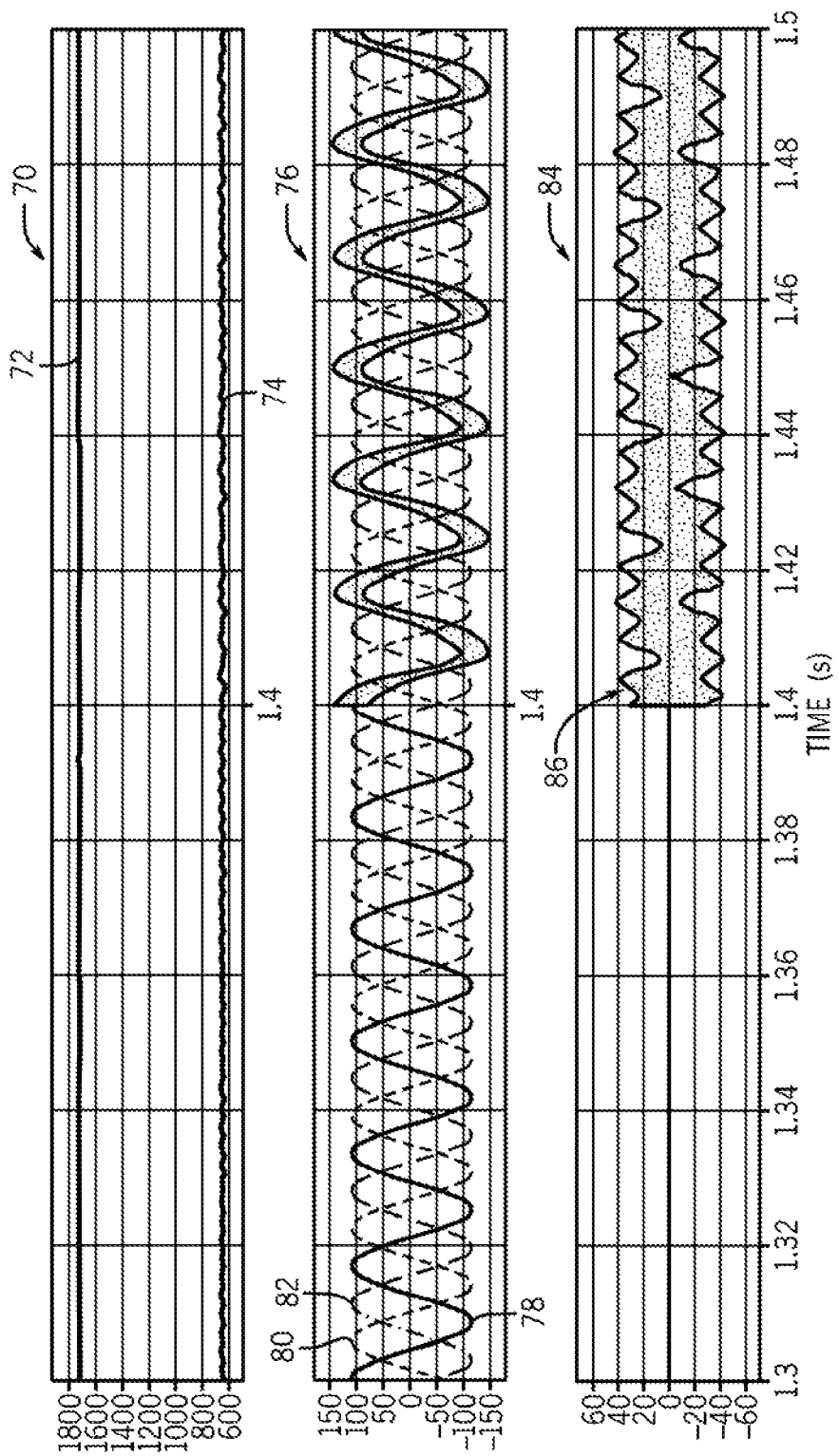
FIG. 3 is a graph illustrating HRG fault characteristics in the ASD of FIG. 1 before and after occurrence of a fault.
Figure 4:
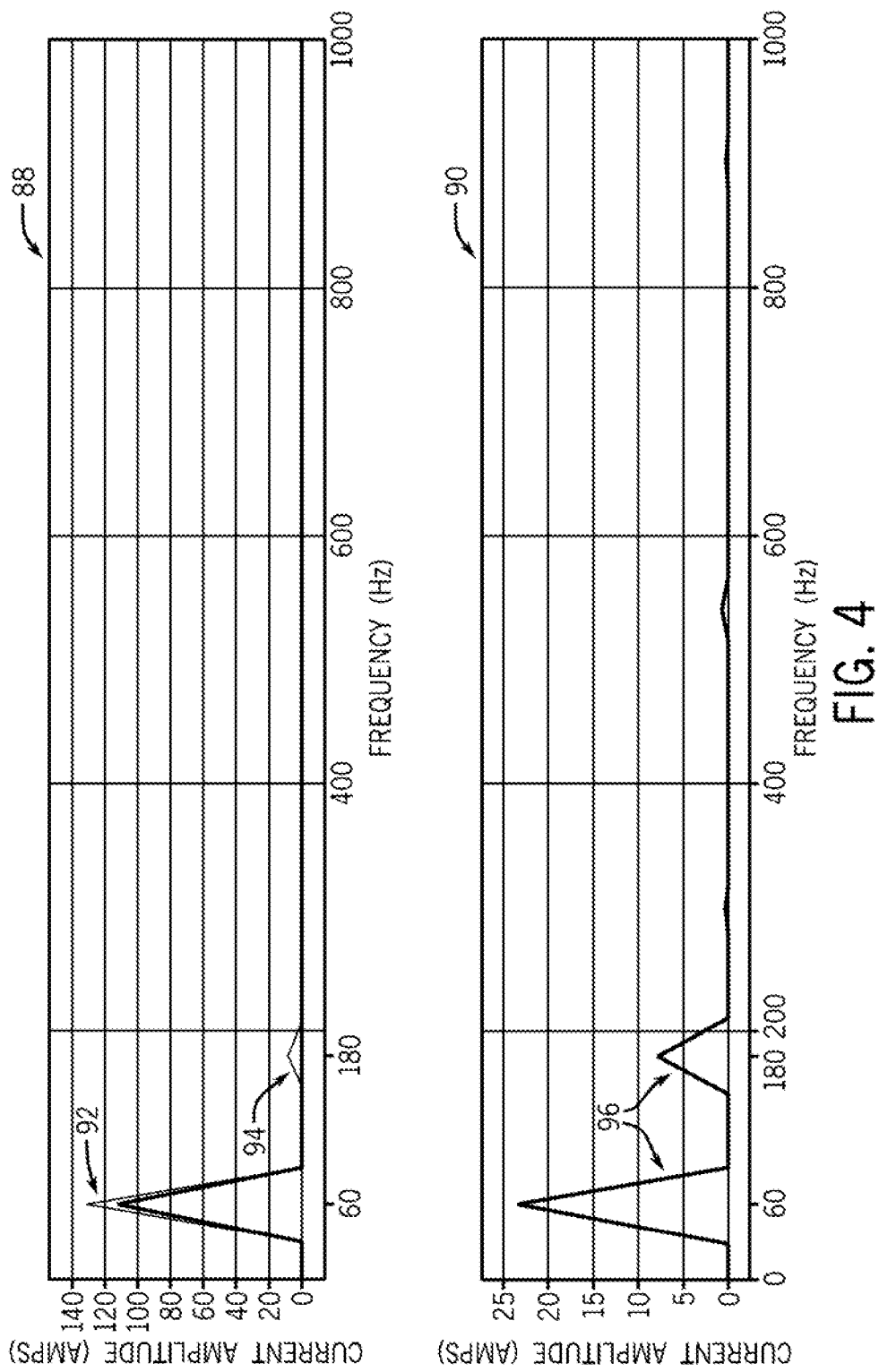
FIG. 4 is a graph illustrating HRG fault harmonics characteristics in the ASD of FIG. 1.

Referring now to FIGS. 3 and 4, HRG fault characteristics and fault harmonics characteristics in power distribution system 10 (FIG. 1) are illustrated, before and after an HRG fault occurs. In the example, shown in FIGS. 3 and 4, the power distribution system is shown as operating normally until a time t=1.4 seconds, at which time a ground fault occurs in one phase (e.g., Phase C).

With respect to FIG. 3, the upper window 70 therein is illustrative of the motor speed 72 and DC link voltage 74, while the middle window 76 is illustrative of the ASD three-phase output currents 78, 80, 82 and the lower window 84 is illustrative of the ground current 86. As can be seen in FIG. 3, the motor speed 72 remains in a steady state before and after occurrence of the ground fault 86 and the DC link voltage 74 remains almost undisturbed. FIG. 3 also shows that the output current on the faulted phase, such as phase current 78, changes in amplitude after occurrence of the ground fault 86. While this change in amplitude of phase current 78 can be tolerated in the system, the current contributes to the overall fault condition in the power distribution system.

With respect to FIG. 4, the upper window 88 therein is illustrative of the current components for each phase of the three-phase current output, while the lower window 90 is illustrative of the ground fault current. As can be seen in upper window 88 of FIG. 4, the amplitude of the fundamental component on the faulted phase, identified as 92, is greater than the amplitude of the fundamental component on the non-faulted phases (e.g., 130 amps versus 110 amps). Additionally, the amplitude of the third harmonic component on the faulted phase, identified as 94, is greater than the amplitude of the third harmonic component on the non-faulted phases. More specifically, the amplitude of the third harmonic component on the non-faulted phases will be zero, while the amplitude of the third harmonic component 94 on the faulted phase may be 10 amps, for example. As shown in the lower window 90, the ground fault current 96.

Thus, as illustrated in FIG. 4, not only can the presence of an HRG fault in the power distribution system be detected based on an analysis of the fundamental and third harmonic components of each phase of the three-phase current output, but the phase and location on/at which the HRG fault occurs can be readily identified.

Beneficially, embodiments of the invention thus provide a system and method of ground fault detection and protection in power distribution systems, including those incorporating an ASD and having an HRG system configuration. The detection methods implement already available three-phase output current measurements and analyze those current measurements in a computationally efficient manner to identify and locate HRG faults in the system. Embodiments of the invention not only identify a ground fault condition in a power distribution system, but also determine exactly which phase out of three motor outputs that a ground fault occurs on.

A technical contribution for the disclosed method and apparatus is that it provides for a computer implemented technique for detecting ground faults in a power distribution system, including systems having an ASD with a HRG configuration. The technique extracts fundamental and third harmonic current components from each phase of a measured three-phase current to detect HRG faults in an ASD, with the technique enabling identification of which phase the ground fault is present on.

According to one embodiment of the present invention, a power distribution system includes a converter-inverter arrangement having an input connectable to a three phase AC power source and a three phase output connectable to an input terminal of a load, the converter-inverter arrangement configured to control current flow and terminal voltages in the load. The power distribution system also includes a fault detection and protection system connected to the converter-inverter arrangement, with the fault detection and protection system including a plurality of current sensors configured to measure a current on the three phase output of the converter-inverter arrangement and a controller configured to measure the three phase current on the three phase output of the converter-inverter arrangement, extract a fundamental current component for each phase of the three phase output of the converter-inverter arrangement, extract a third harmonic component for each phase of the three phase output of the converter-inverter arrangement, compare the fundamental current component and the third harmonic component extracted from each phase to a first threshold and a second threshold, respectively, and detect a ground fault on a phase of the three phase output based on the comparisons of the fundamental current component and the third harmonic component to the first and second thresholds.

According to another embodiment of the present invention, a method is provided for detecting a high resistance ground fault in a power distribution system that includes an AC motor drive in series between an AC power source and an AC motor, with the AC motor drive configured to condition a three phase output to the AC motor. The method includes measuring current on each of a first phase, a second phase, and a third phase of the three phase output to the AC motor, extracting a fundamental current component for each of the first phase, second phase, and third phase, and extracting a third harmonic component for each of the first phase, second phase, and third phase. The method also includes comparing the fundamental current component and the third harmonic component extracted from each of the first phase, second phase, and third phase to a fundamental component threshold and a third harmonic threshold, respectively and detecting a ground fault on any of the first phase, second phase, and third phase based on the comparisons of the fundamental current component and the third harmonic component on each phase to the fundamental and third harmonic thresholds. If a ground fault is detected, the method further includes identifying on which of the first phase, second phase, or third phase the ground fault is present.

According to yet another embodiment of the present invention, a system for detecting a ground fault in a high resistance ground (HRG) power distribution system includes a plurality of current sensors to measure current on a three phase output of an inverter in the HRG power distribution system and a controller configured to measure the three phase current on the three phase output of the inverter, extract a fundamental current component for each phase of the three phase output, extract a third harmonic component for each phase of the three phase output, compare the fundamental current component and the third harmonic component extracted from each phase to a fundamental component threshold and a third harmonic component threshold, respectively, and detect a ground fault on a phase of the three phase output based on the comparisons of the fundamental current component and the third harmonic component on each phase to the fundamental component and third harmonic component thresholds.

The present invention has been described in terms of the preferred embodiment, and it is recognized that equivalents, alternatives, and modifications, aside from those expressly stated, are possible and within the scope of the appending claims.

What is claimed is:

1. A power distribution system comprising:
a converter-inverter arrangement having an input connectable to a three phase AC power source and a three phase output connectable to an input terminal of a load, the converter-inverter arrangement configured to control current flow and terminal voltages in the load; and
a fault detection and protection system connected to the converter-inverter arrangement, the fault detection and protection system comprising:
a plurality of current sensors configured to measure a current on the three phase output of the converter-inverter arrangement; and
a controller configured to:
measure the three phase current on the three phase output of the converter-inverter arrangement;
extract a fundamental current component for each phase of the three phase output of the converter-inverter arrangement;
extract a third harmonic component for each phase of the three phase output of the converter-inverter arrangement;
compare the fundamental current component and the third harmonic component extracted from each phase to a first threshold and a second threshold, respectively;
detect a ground fault on a phase of the three phase output based on the comparisons of the fundamental current component and the third harmonic component to the first and second thresholds; and
declare a ground fault when one phase of the three phase output has a fundamental current component that exceeds the first threshold and a third harmonic component that exceeds the second threshold.

2. The power distribution system of claim 1 wherein the controller is configured to identify which phase of the three phase output the ground fault is present on.

3. The power distribution system of claim 1 wherein the controller is configured to generate an alarm when a ground fault is declared.

4. The power distribution system of claim 3 wherein the controller is configured to define the phase current on each phase of the three phase output as:

$$i = I_1 * \cos\theta + I_3 * \cos 3\theta,$$

where $I_1$ is the amplitude of the fundamental current component, $I_3$ is the amplitude of the third harmonic component, and $\theta$ is the speed at which the load is commanded to run.

5. The power distribution system of claim 4 wherein the controller is configured to extract the fundamental current component without using a total fast fourier transform (FFT), the fundamental current component being extracted according to:

$$\frac{1}{2\pi}\int_0^{2\pi}(I_1\cos\theta + I_3\cos 3\theta) * \cos\theta * d\theta = \frac{I_1}{2}$$

$$\frac{1}{2\pi}\int_0^{2\pi}(I_1\cos\theta + I_3\cos 3d\theta) * \sin\theta * d\theta = 0,$$

where $I_1$ is the amplitude of the fundamental current component, $I_3$ is the amplitude of the third harmonic component, and $\theta$ is the speed at which the load is commanded to run.

6. The power distribution system of claim 4 wherein the wherein the controller is configured to extract the third harmonic component according to:

$$\frac{1}{2\pi}\int_0^{2\pi}(I_1\cos\theta + I_3\cos 3d\theta) * \cos 3\theta * d\theta = \frac{I_3}{2}$$

$$\frac{1}{2\pi}\int_0^{2\pi}(I_1\cos\theta + I_3\cos 3\theta) * \sin 3\theta * d\theta = 0,$$

where $I_1$ is the amplitude of the fundamental current component, $I_3$ is the amplitude of the third harmonic component, and $\theta$ is the speed at which the load is commanded to run.

7. The power distribution system of claim 1 wherein the third harmonic component is zero on phases where there is no ground fault.

8. The power distribution system of claim 1 further comprising a resistor positioned between a neutral point of the three phase AC power source and earth ground, such that the power distribution system comprises a high resistance ground (HRG) system.

9. The power distribution system of claim 8 wherein the converter-inverter arrangement comprises an adjustable speed drive (ASD), and wherein the controller is further configured to filter out switching frequency components from the measured three phase current generated by switching of a plurality of switches in the ASD.

10. A method for detecting a high resistance ground fault in a power distribution system that includes an AC motor drive in series between an AC power source and an AC motor, with the AC motor drive configured to condition a three phase output to the AC motor, wherein the method comprises:
measuring current on each of a first phase, a second phase, and a third phase of the three phase output to the AC motor;
extracting a fundamental current component for each of the first phase, second phase, and third phase;
extracting a third harmonic component for each of the first phase, second phase, and third phase;
comparing the fundamental current component and the third harmonic component extracted from each of the first phase, second phase, and third phase to a fundamental component threshold and a third harmonic threshold, respectively;
detecting a ground fault on any of the first phase, second phase, and third phase based on the comparisons of the fundamental current component and the third harmonic component on each phase to the fundamental and third harmonic thresholds; and
if a ground fault is detected:
identifying on which of the first phase, second phase, or third phase the ground fault is present; and
declaring a ground fault when a phase of the three phase output has a fundamental current component that exceeds the fundamental component threshold and a third harmonic component that exceeds the third harmonic threshold.

11. The method of claim 10 further comprising defining the phase current on each of the first phase, second phase, and third phase as:

$$i = I_1 * \cos\theta + I_3 * \cos 3\theta,$$

where $I_1$ is the amplitude of the fundamental current component, $I_3$ is the amplitude of the third harmonic component, and $\theta$ is the speed at which the load is commanded to run.

12. The method of claim 10 wherein extracting the fundamental current component comprises extracting the fundamental current component according to:

$$\frac{1}{2\pi}\int_0^{2\pi}(I_1\cos\theta + I_3\cos 3\theta)*\cos\theta*d\theta = \frac{I_1}{2}$$

$$\frac{1}{2\pi}\int_0^{2\pi}(I_1\cos\theta + I_3\cos 3\theta)*\sin\theta*d\theta = 0,$$

where $I_1$ is the amplitude of the fundamental current component, $I_3$ is the amplitude of the third harmonic component, and $\theta$ is the speed at which the load is commanded to run.

13. The method of claim 10 wherein extracting the third harmonic component comprises extracting the third harmonic component according to:

$$\frac{1}{2\pi}\int_0^{2\pi}(I_1\cos\theta + I_3\cos 3\theta)*\cos 3\theta*d\theta = \frac{I_3}{2}$$

$$\frac{1}{2\pi}\int_0^{2\pi}(I_1\cos\theta + I_3\cos 3\theta)*\sin 3\theta*d\theta = 0,$$

where $I_1$ is the amplitude of the fundamental current component, $I_3$ is the amplitude of the third harmonic component, and $\theta$ is the speed at which the load is commanded to run.

14. The method of claim 10 further comprising filtering out switching frequency components from the current measured on each of the first phase, second phase, and third phase, so as to further isolate the fundamental current component and the third harmonic component.

15. A system for detecting a ground fault in a high resistance ground (HRG) power distribution system, the system comprising:
a plurality of current sensors to measure current on a three phase output of an inverter in the HRG power distribution system; and
a controller configured to:
measure the three phase current on the three phase output of the inverter;
extract a fundamental current component for each phase of the three phase output;
extract a third harmonic component for each phase of the three phase output;
compare the fundamental current component and the third harmonic component extracted from each phase to a fundamental component threshold and a third harmonic component threshold, respectively;
detect a ground fault on a phase of the three phase output based on the comparisons of the fundamental current component and the third harmonic component on each phase to the fundamental component and third harmonic component thresholds; and
declare a ground fault when one phase of the three phase output has a fundamental current component that exceeds the fundamental component threshold and a third harmonic component that exceeds the third harmonic component threshold.

16. The system of claim 15 wherein the controller is configured to identify which phase of the three phase output the ground fault is present on based on the extraction of the fundamental current component and the third harmonic component extracted from each phase.

17. The system of claim 15 wherein the third harmonic component is zero on phases where there is no ground fault.

* * * * *

UNITED STATES PATENT AND TRADEMARK OFFICE
CERTIFICATE OF CORRECTION

PATENT NO. : 9,046,560 B2  Page 1 of 1
APPLICATION NO. : 13/487322
DATED : June 2, 2015
INVENTOR(S) : Li It is certified that error appears in the above-identified patent and that said Letters Patent is hereby corrected as shown below:

In the Claims

Col. 10, line 12 (Claim 6), delete "wherein the controller" and substitute therefore -- controller --; and Col. 10, line 17 (Claim 6), delete " $\frac{1}{2\pi}\int_0^{2\pi}(I_1\cos\theta + I_3\cos 3d\theta)*\cos\theta*d\theta = \frac{I_1}{2}$ " and substitute therefore -- $\frac{1}{2\pi}\int_0^{2\pi}(I_1\cos\theta + I_3\cos 3\theta)*\cos\theta*d\theta = \frac{I_1}{2}$ --.

Signed and Sealed this
Third Day of November, 2015

Michelle K. Lee
*Director of the United States Patent and Trademark Office*